US008816306B2

(12) United States Patent
Yano, Jr. et al.

(10) Patent No.: US 8,816,306 B2
(45) Date of Patent: Aug. 26, 2014

(54) INFRARED LIGHT DEVICE

(71) Applicants: Robert A. Yano, Jr., Galloway, OH (US); Joseph W. Martin, Centerburg, OH (US); Darren J. Wolfe, Hilliard, OH (US)

(72) Inventors: Robert A. Yano, Jr., Galloway, OH (US); Joseph W. Martin, Centerburg, OH (US); Darren J. Wolfe, Hilliard, OH (US)

(73) Assignee: Battelle Memorial Institute, Columbus, OH (US)

( * ) Notice: Subject to any disclaimer, the term of this patent is extended or adjusted under 35 U.S.C. 154(b) by 0 days.

(21) Appl. No.: 13/713,068

(22) Filed: Dec. 13, 2012

(65) Prior Publication Data

US 2013/0155714 A1 Jun. 20, 2013

Related U.S. Application Data

(60) Provisional application No. 61/576,072, filed on Dec. 15, 2011.

(51) Int. Cl.
*G21K 5/04* (2006.01)

(52) U.S. Cl.
USPC ......... 250/504 R; 250/493.1; 250/494.1; 250/495.1; 250/503.1; 359/350; 359/355; 359/356; 362/459; 362/460; 362/464; 362/487; 362/509

(58) Field of Classification Search
USPC .......... 359/350, 355, 356; 362/459, 460, 464, 362/487, 508, 509; 250/493.1, 494.1, 250/495.1, 503.1, 504 R
See application file for complete search history.

(56) References Cited

U.S. PATENT DOCUMENTS

| | | | |
|---|---|---|---|
| 5,055,697 | A | 10/1991 | Manoogian et al. |
| 6,100,952 | A | 8/2000 | Marvin et al. |
| 6,491,417 | B1 | 12/2002 | Haen et al. |
| 6,520,669 | B1 | 2/2003 | Chen et al. |
| 6,626,558 | B2 | 9/2003 | Momot et al. |
| 6,783,260 | B2 | 8/2004 | Machi et al. |
| 6,902,299 | B2 | 6/2005 | Zhan et al. |
| 6,976,772 | B2 | 12/2005 | Albou et al. |
| 6,984,061 | B1 | 1/2006 | Soderberg et al. |
| 7,055,986 | B2 | 6/2006 | Littleton |
| 7,059,752 | B2 | 6/2006 | Yagi et al. |
| 7,070,299 | B2 | 7/2006 | Williams et al. |
| 7,081,991 | B2 | 7/2006 | Jones et al. |
| 7,086,756 | B2 | 8/2006 | Maxik |
| 7,125,134 | B1 | 10/2006 | Hedlund et al. |
| 7,244,049 | B2 | 7/2007 | Suzuki |
| 7,312,477 | B2 | 12/2007 | Yatsuda et al. |
| 7,322,723 | B2 | 1/2008 | Griesinger et al. |
| 7,331,690 | B2 | 2/2008 | Schmidt |
| 7,344,279 | B2 | 3/2008 | Mueller et al. |
| 7,387,414 | B2 | 6/2008 | Helms et al. |
| 7,396,147 | B2 | 7/2008 | Munro |
| 7,413,327 | B2 | 8/2008 | Guard et al. |

(Continued)

OTHER PUBLICATIONS

Filtron; E800; by Gentex; 1998; 1 page.

(Continued)

*Primary Examiner* — Nicole Ippolito
(74) *Attorney, Agent, or Firm* — Stevens & Showalter, LLP

(57) ABSTRACT

An infrared (IR) light device is provided comprising: a main casing filled with a gas to prevent condensation from forming on an interior surface of the visible light filter; and a plurality of IR light emitting diodes (LEDs) mounted in the main casing, wherein the casing includes heat dissipating features.

20 Claims, 11 Drawing Sheets

(56) References Cited

U.S. PATENT DOCUMENTS

| | | |
|---|---|---|
| 7,529,478 B2 | 5/2009 | Cutler et al. |
| 7,566,155 B2 | 7/2009 | Schug et al. |
| 7,575,350 B2 | 8/2009 | Nguyen |
| 7,667,585 B2 | 2/2010 | Marchal |
| 7,683,548 B2 | 3/2010 | Kupper et al. |
| 7,825,325 B2 | 11/2010 | Kennedy et al. |
| 7,854,538 B2 | 12/2010 | Helms |
| 2005/0041435 A1 | 2/2005 | Moisel |
| 2007/0025106 A1 | 2/2007 | Robinson |
| 2007/0041181 A1 | 2/2007 | Shofar |
| 2009/0116210 A1 | 5/2009 | Cutler et al. |
| 2009/0116257 A1 | 5/2009 | Rosemeyer et al. |
| 2010/0109531 A1* | 5/2010 | Helms et al. ............ 315/82 |
| 2010/0220490 A1 | 9/2010 | Bushell et al. |
| 2010/0302779 A1 | 12/2010 | Chemel et al. |
| 2011/0115645 A1* | 5/2011 | Hall et al. ............ 340/907 |
| 2011/0176326 A1 | 7/2011 | Stephan |

OTHER PUBLICATIONS

Epitex Inc.; SMB880-1100-01-I; Opto-Device & Custom LED; High Power Top LED SMB880-1100-01-I; pp. 1-6.

Adventure Lights; Stealth Illuminator; Product No. 02710; Doc. ID: 02710(PS)R6; 2 pages; Feb. 2011.

Tactronics; IR & ELRIR Lights; Infrared & Enhanced Long Range Infrared Lights; Thermal/Infrared Systems; 1 page; 2008.

* cited by examiner

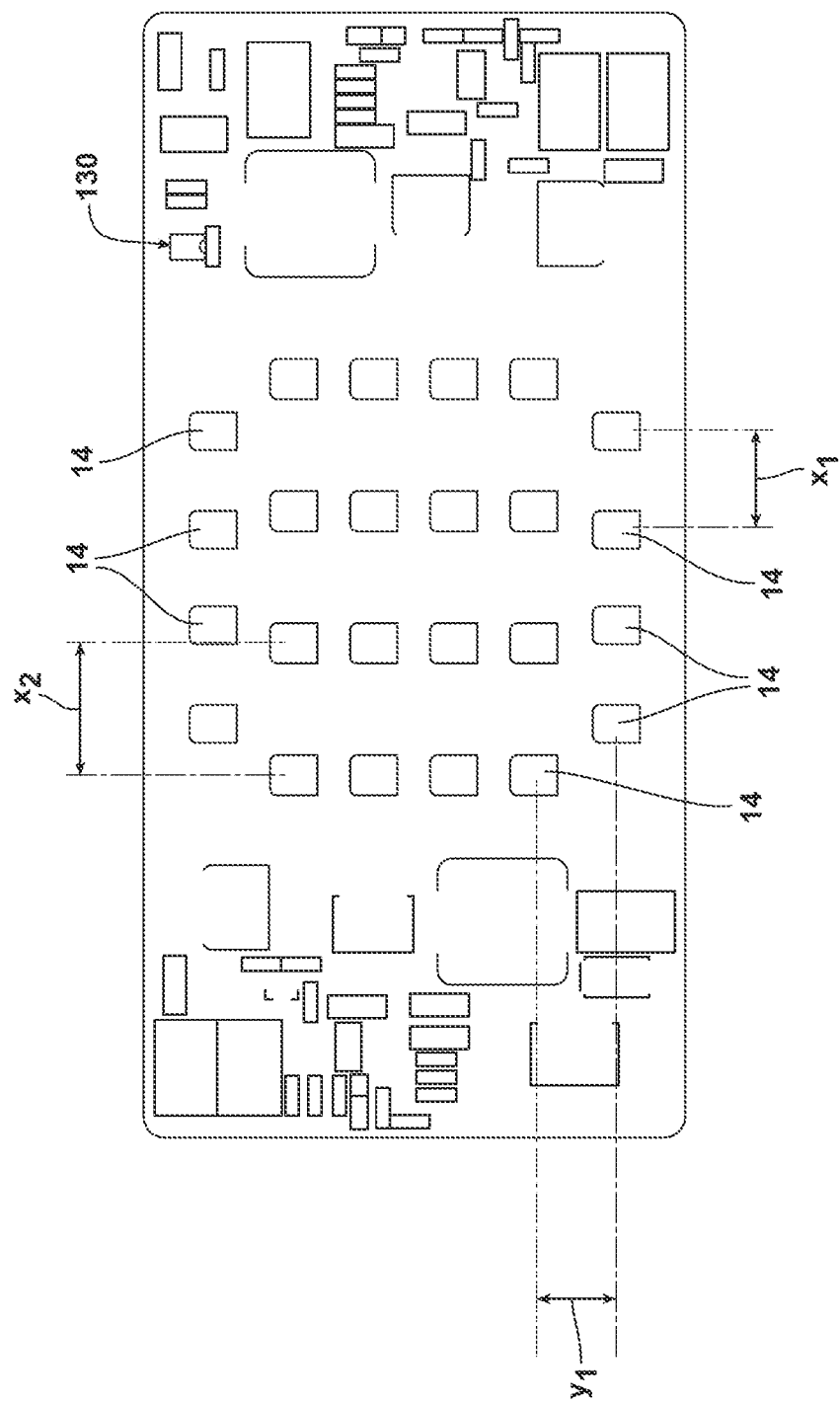

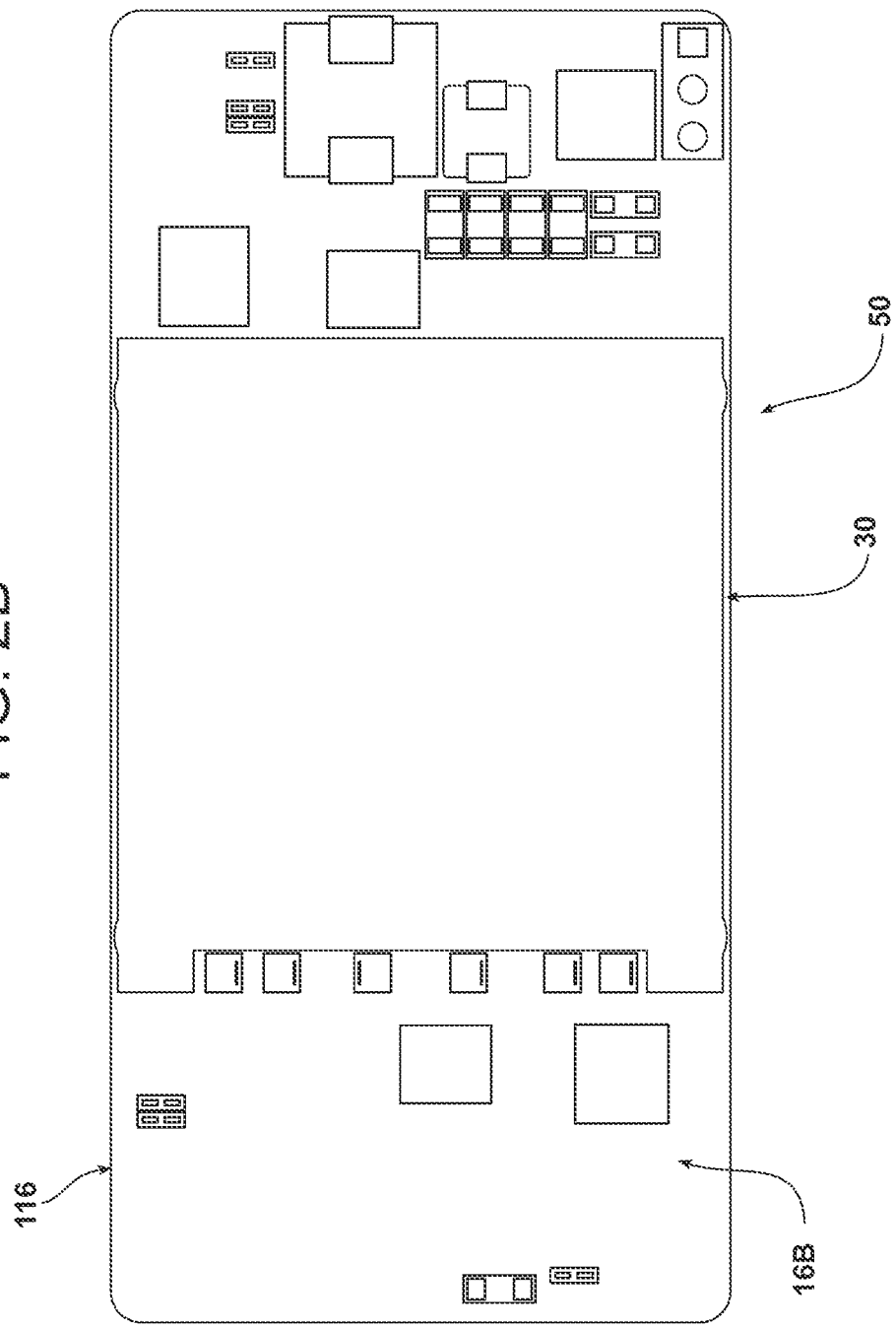

INFRARED LIGHT DEVICE

This application claims the benefit of U.S. Provisional Application No. 61/576,072, filed Dec. 15, 2011 and entitled "INFRARED LIGHT DEVICE"; the disclosure of which is incorporated herein by reference.

FIELD OF THE INVENTION

The present invention relates to an infrared light device and, more specifically, to such a device having a plurality of IR light emitting diodes encased in a gas filled housing and a light filter allowing IR light to pass while blocking a substantial portion of visible "red" light.

BACKGROUND OF THE INVENTION

U.S. Pat. No. 5,055,697 discloses an infrared illuminator for use in a surveillance system where it is desired to direct a beam of infrared (IR) radiation to illuminate a desired area. The illuminator comprises a radiation filter, which is disposed in the path of the beam for selectively absorbing visible light and passing infrared radiation emitted by a light source within the illuminator.

It is known in the prior art to provide an IR light device having one or more IR light emitting diodes, which device may be mounted on a vehicle to emit IR light to illuminate a desired area. Night vision goggles may be used in conjunction with such an IR light device, wherein the night vision goggles can sense radiation invisible to a human observer.

SUMMARY OF THE INVENTION

In accordance with a first aspect of the present invention, an infrared (IR) light device is provided comprising: a main casing filled with a gas to prevent condensation from forming on an interior surface of the light filter; and a plurality of IR light emitting diodes (LEDs) mounted in the main casing.

The light device may further comprise structure for transferring heat from the LEDs to the main casing. The heat transfer structure may comprise: copper fillings positioned in bores in a circuit card to which the LEDs are mounted, the copper fillings being coupled to the LEDs; a metal plate positioned to contact the copper fillings; and thermal transfer elements contacting the metal plate and the main casing.

The light device may further comprise a main circuit card assembly comprising a main or primary circuit card to which the LEDs are mounted; a temperature sensor for sensing when a temperature of the circuit card assembly exceeds a predefined threshold temperature; and control structure for turning off a portion but not all of the LEDs when the circuit card assembly temperature exceeds the predefined threshold temperature.

A switch in a vehicle to which the light device is mounted may generate a signal to the control structure for turning off a portion but not all of the LEDs.

The light device may be capable of operating at a voltage falling within a voltage range of from 10 VDC to 32 VDC.

The light device may further comprise a light filter allowing IR light to pass through an opening in the main casing and blocking a substantial portion of visible "red" light emitted by the LEDs.

The gas may comprise argon or nitrogen.

In accordance with a second aspect of the present invention, an infrared (IR) light device is provided comprising: a main casing; a plurality of IR light emitting diodes mounting in the main casing; a temperature sensor for sensing when a temperature within the main casing exceeds a predefined threshold; and control structure for turning off a portion but not all of the LEDs when the temperature exceeds the predefined threshold.

The light device may further comprise a circuit card assembly comprising a circuit card to which the LEDs are mounted. The temperature sensor may sense when a temperature of the circuit card assembly exceeds the predefined threshold temperature. The control structure may turn off the portion of the LEDs when the temperature of the circuit card assembly exceeds the predefined threshold.

A switch in a vehicle to which the light device is mounted may generate a signal to the control structure for turning off a portion but not all of the LEDs.

In accordance with a third aspect of the present invention, an infrared (IR) light device is provided comprising: a main casing; a plurality of IR light emitting diodes (LEDs) mounted in the main casing; control structure coupled to the LEDs for actuating the LEDs; and a common mode filter associated with the control structure for reducing electromagnetic interference (EMI).

The control structure may comprise at least one control circuit and at least one power switching transistor.

The light device may further comprise a resistor provided between the one control circuit and the one power switching transistor.

A switch in a vehicle to which the light device is mounted may generate a signal to the control structure for turning off a portion but not all of the LEDs.

BRIEF DESCRIPTION OF THE DRAWINGS

FIG. 1A is a view of a main circuit card assembly of the light device with IR LEDs coupled to it;

FIGS. 2A and 2B are front and rear views of the main circuit card assembly of the light device;

DETAILED DESCRIPTION OF THE INVENTION

Figure 1:
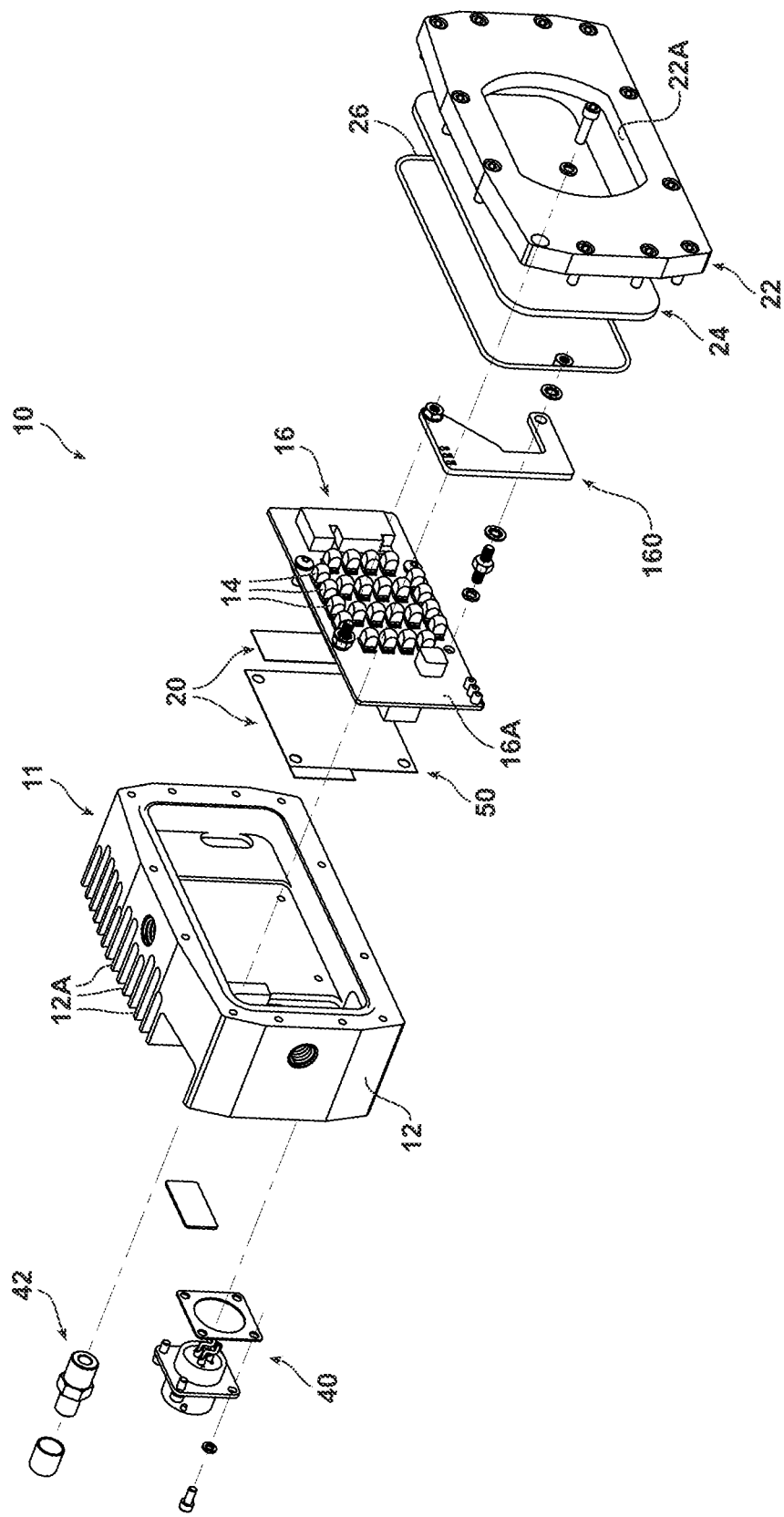
FIG. 1 is an exploded view of an infrared (IR) light device constructed in accordance with the present invention.
Figure 2A:
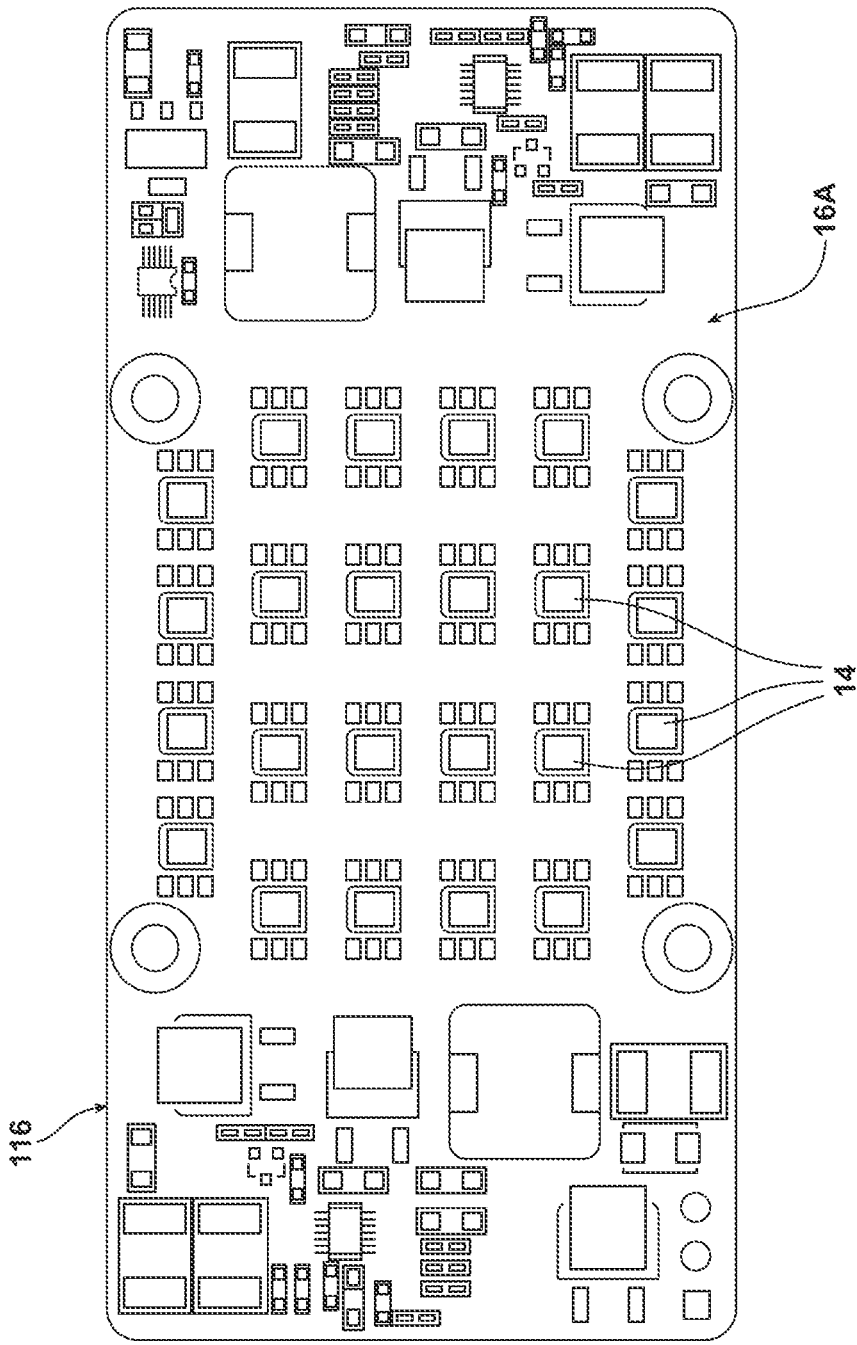
Figure 3:
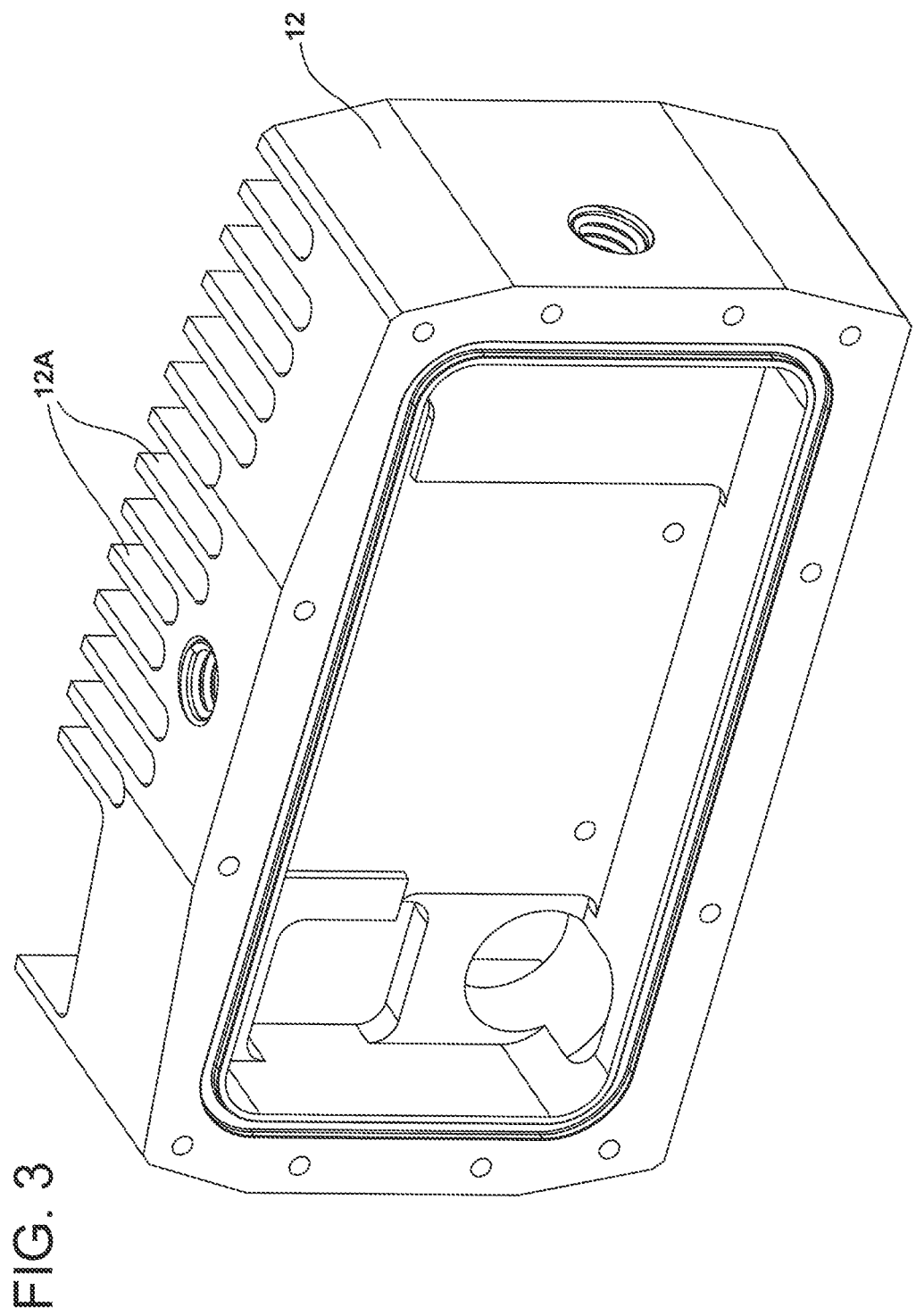
FIGS. 3 and 4 are views of the main casing of the light device.
Figure 4:
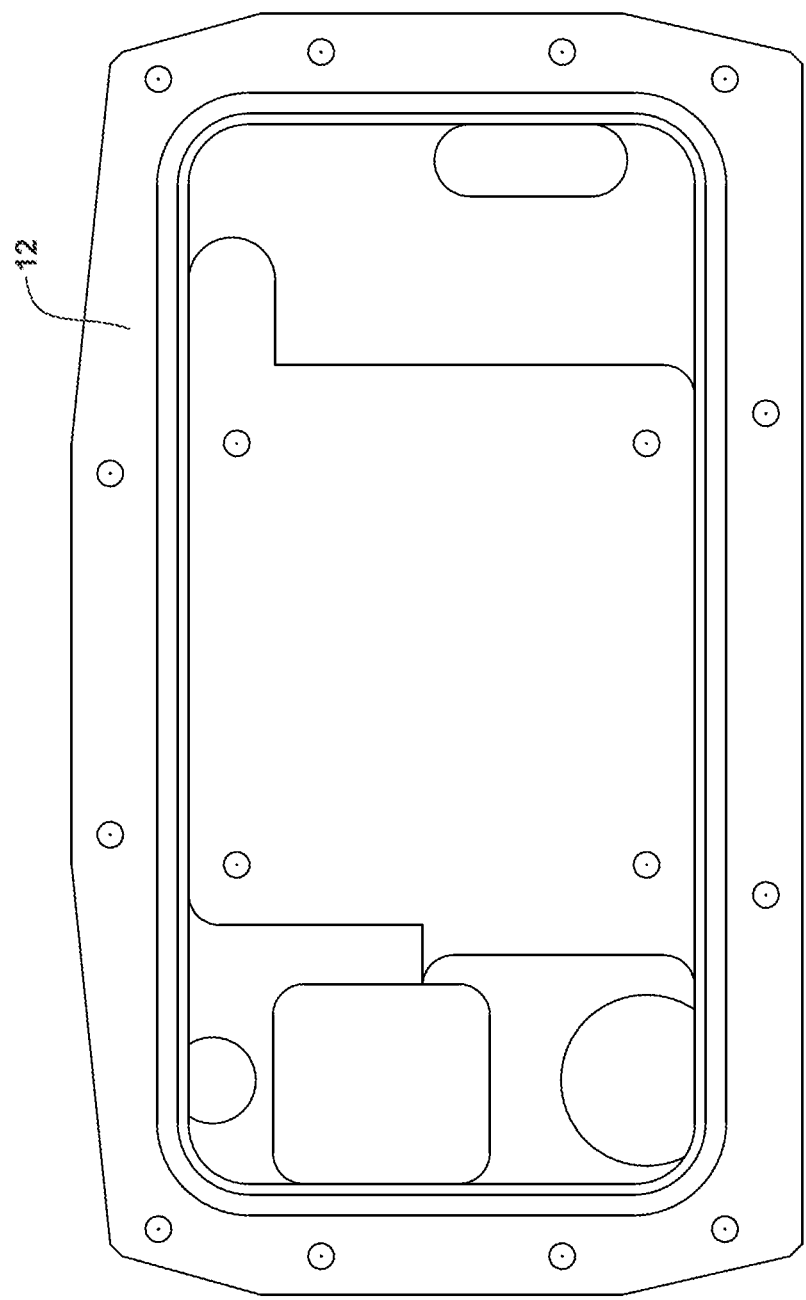
Figure 5:
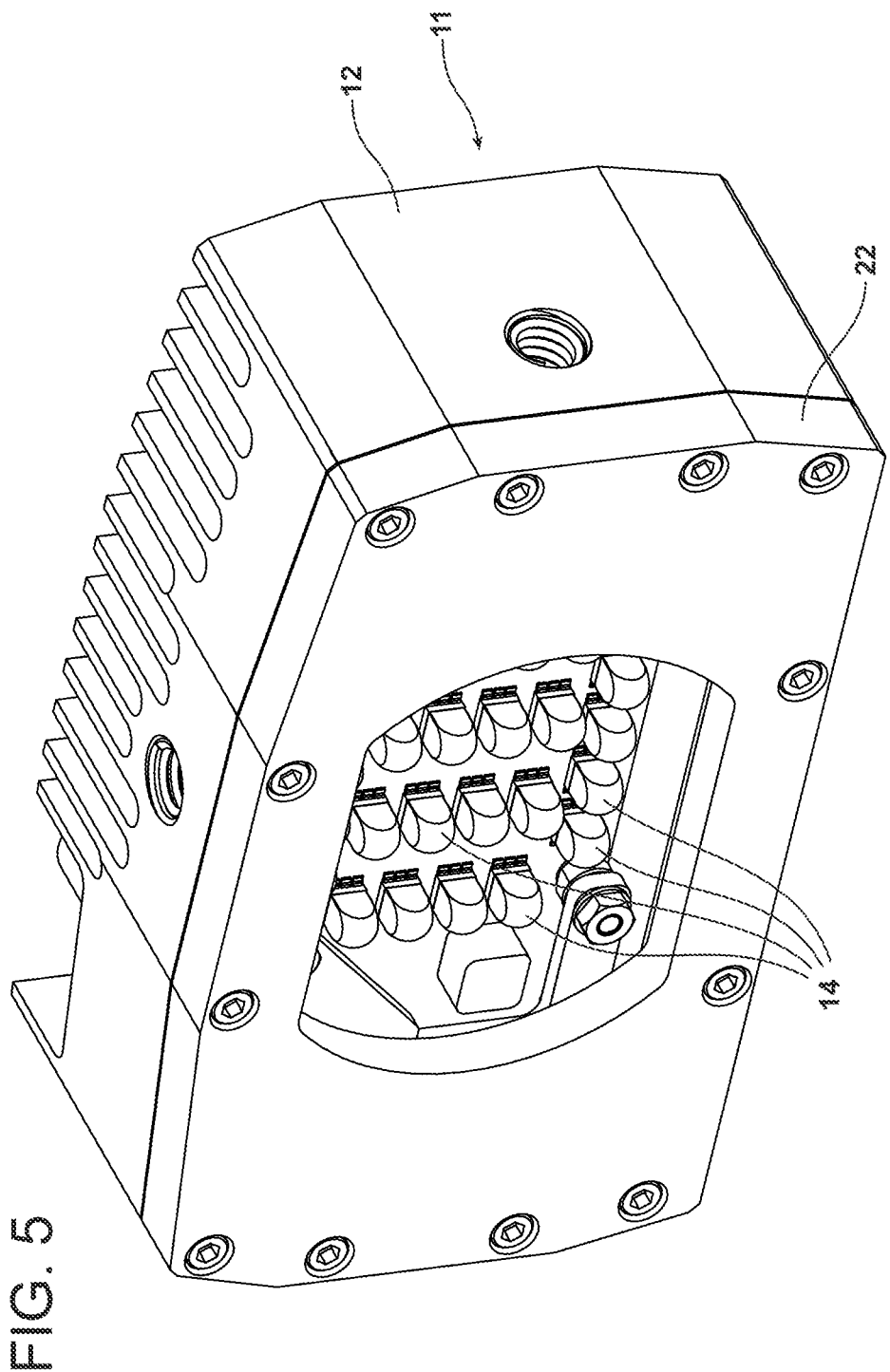
FIGS. 5 and 6 are front and rear views of the light device with the visible light filter removed in FIG. 5.
Figure 6:
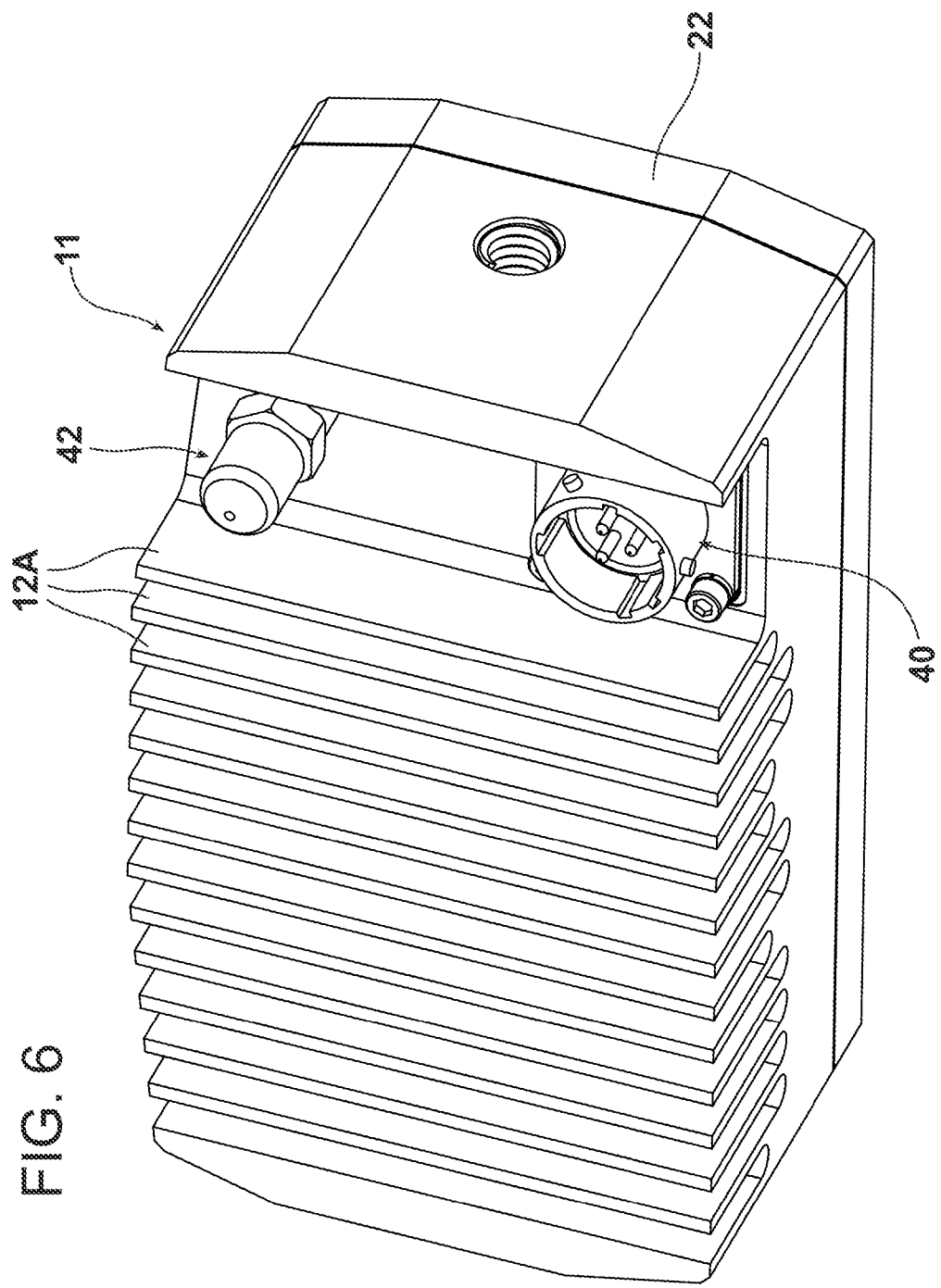

An infrared (IR) light device 10 is illustrated in FIG. 1 for use as an IR illuminator. The IR device 10 may be used as part of a stationary or mobile night-vision system. The IR light device 10 comprises a main casing 11 comprising a base 12 having cooling fins 12A, see also FIGS. 3-6, and a face plate 22 coupled to the base 12. The face plate 22 comprises an opening 22A, see FIG. 1. The IR light device 10 also comprises a plurality of IR light emitting diodes (LEDs) 14 mounted to a substantially rigid main circuit card assembly 16, flexible heat transfer pads 20, a visible light filter 24, an input power connector 40 and a gas input/release valve 42, see attached FIGS. 1, 2 and 6. The light filter 24 is coupled to the face plate 22 so as to cover the face plate opening 22A. The LEDs 14 may emit light in the wavelength range of from about 800 nm to about 1000 nm, and preferably about 880 nm.

The device 10 is adapted to be mounted to a vehicle, e.g., a vehicle bumper or roll bar, for illuminating objects at night so as to allow personnel to "see" objects via IR night vision goggles.

Figure 1B:
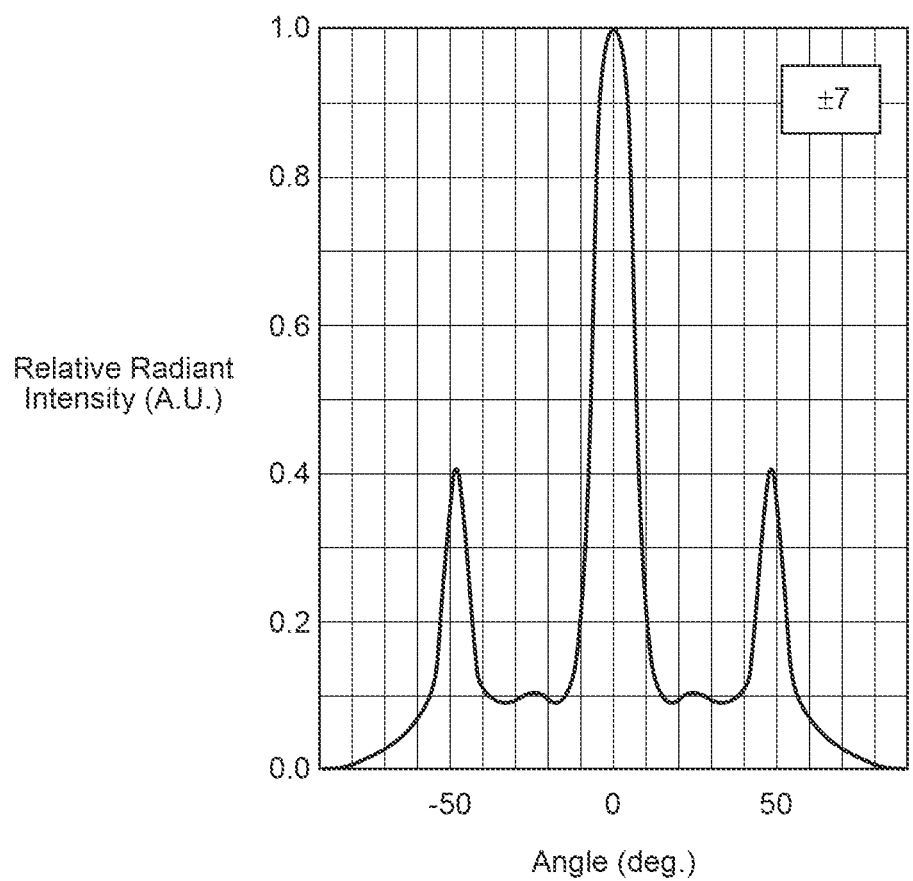
FIG. 1B illustrates a radiation pattern for each of the IR LEDs of the illustrated embodiment.

It is contemplated that the light device 10 may comprise between about four and twenty-four LEDs 14, preferably between about eight and twenty-four LEDs 14 and most preferably about twenty-four LEDs 14. It is believed that as the number of LEDs 14 increases up to twenty-four LEDs, the forward distance and outward periphery of a combined beam generated by the light device 10 is increased in intensity. Four LEDs 14 may generate an IR intensity of about 1200 mW/sr and twenty-four LEDs 14 may generate an IR intensity of about 7500 mW/sr, wherein "sr"=steradian. In the illustrated embodiment, twenty-four LEDs 14 are provided. The LEDs 14 may comprise those that are commercially available from Epitex, Inc., Kyoto, Japan, under the product designation "SMB880-1100-01-I." Each of the LEDs 14 may have a radiation pattern as shown in FIG. 1B defining a corresponding beam having a narrow center portion and outer nodes. A plurality of the beams emitted by the plurality of LEDs 14 define a combined IR beam having a wide lateral range to illuminate peripheral areas of a vehicle while also being far reaching in a forward or outward direction. The LEDs 14 may be spaced apart from one another in an X direction by a distance of $x_1$=0.370 inch or $x_2$=0.500 inch and in a Y direction by a distance of $y_1$=0.300 inch, see FIG. 1A.

The main casing 11 is purged by and pressurized with either Argon or Nitrogen gas so as to prevent condensation from forming on an internal surface of the light filter 24. The Argon or Nitrogen is input into the main casing 11 via the gas input/release valve 42. An O-ring 26 is provided between the main casing 11 and the visible light filter 24 so as to create a seal between the main casing 11 and the visible light filter 24.

A 3-position switch (not shown) in a vehicle cabin permits an operator to turn off ½ of the LEDs to reduce the intensity of the IR light for example when other vehicles are near. There are three switch positions in the vehicle cabin: off, low beam and high beam. An operator may turn the switch to the "low beam" position when traveling near one or more other vehicles so as to avoid irritating/disrupting an operator wearing IR goggles with a high intensity IR light.

Figure 7:
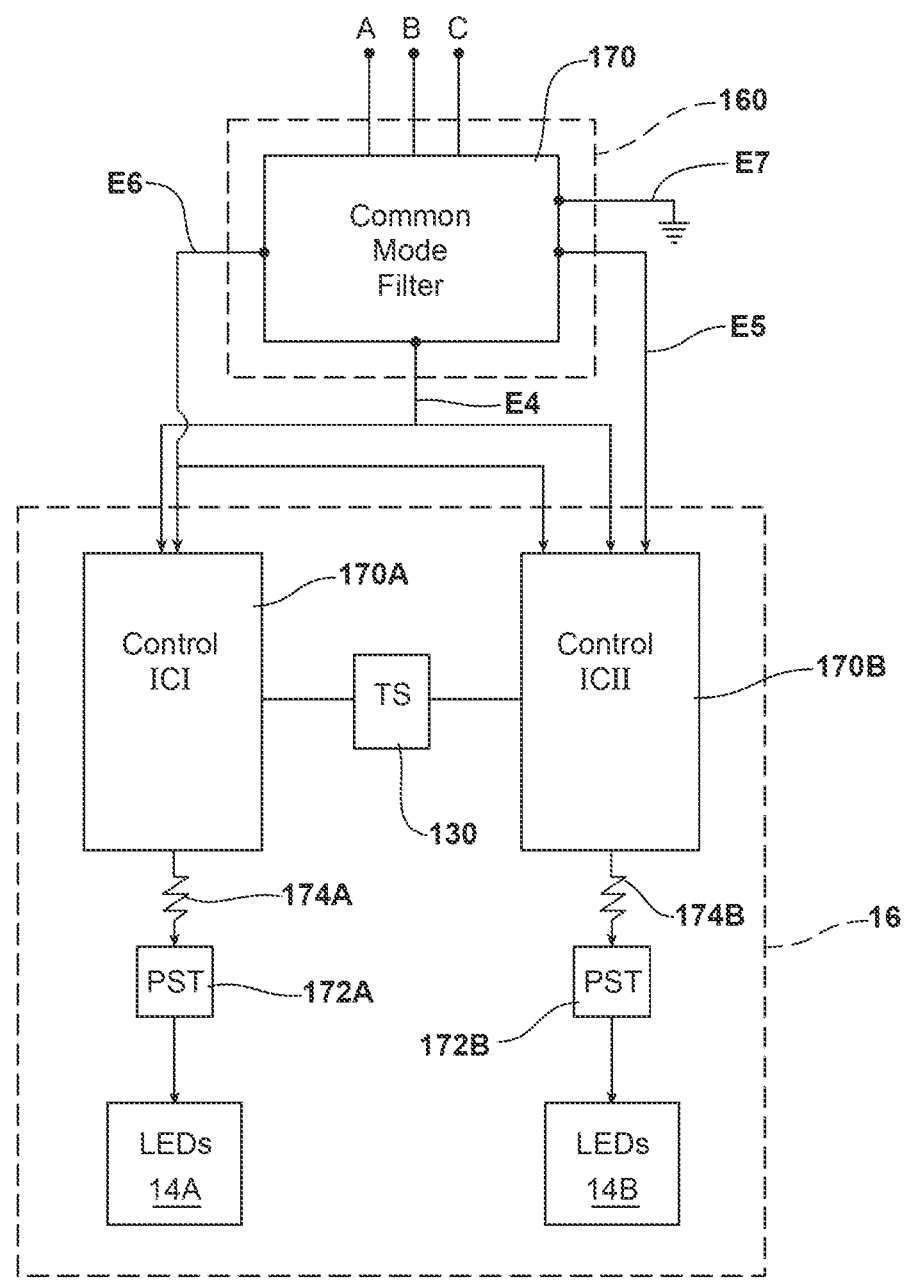
FIG. 7 is a schematic diagram of the main circuit card assembly with IR LEDs mounted to it and a secondary circuit card assembly.

In accordance with the present invention a secondary circuit card assembly 160 is provided comprising a common mode filter 170 so as to reduce electromagnetic interference (EMI) generated by the IR light device 10, see FIGS. 1 and 7. The EMI, if not reduced, may cause interference with other systems on the vehicle to which the device 10 is mounted, such as communication systems. The common mode filter 170 also reduces electrical noise coming from the vehicle which can result in magnified EMI. The common mode filter 170, in the illustrated embodiment, was designed so as to remove problematic frequencies in power signals provided on a line A, defining a battery-in line, and a line B, defining a battery-return line, see FIG. 7. The common mode filter 170 further removes problematic frequencies generated by first and second power switching transistors 172A and 172B, which are discussed below. Line C, also illustrated in FIG. 7, comprises a dim signal line. The 3-position switch generates a low beam or dim signal when in the "low beam" position, which dim signal is provided on line C. The secondary circuit card assembly 160 is housed within the main casing 11, see FIG. 1. Accordingly, the problem frequency ranges are determined using known techniques. With knowledge of the problematic frequencies, one skilled in the art can design a common mode filter 170 capable of reducing such problematic frequencies.

Figure 8:
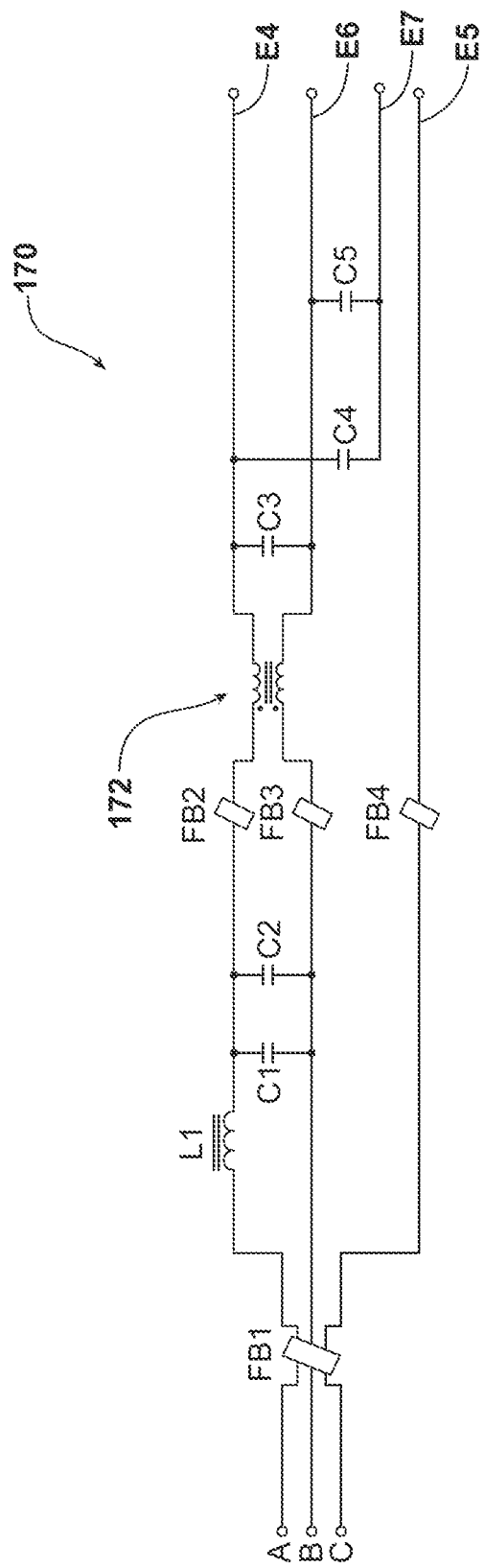
FIG. 8 is a schematic diagram of a common mode filter provided on the secondary circuit card assembly.

In the illustrated embodiment, the common mode filter 170 comprises a choke/capacitor filter on the input lines A and B including capacitive coupling of signals to the vehicle chassis ground along line E7, see FIG. 8. More specifically, the common mode filter 170 comprises a common-mode choke 172 and first, second, third, fourth and fifth capacitors C1-C5. The third capacitor C3 across the common mode choke 172 has a value of 1000 pF and provides an impedance of about 1Ω across the power lines A and B at approximately a mid-range frequency, providing good impedance mismatch to prevent common-mode noise from entering the device 10. The first, second, fourth and fifth capacitors C1, C2, C4 and C5 each have a value of 240 pF. The common mode filter 170 further comprises an inductor L1 having a value of 0.33 H and an impedance of about 1000Ω. The common mode filter 170 also comprises a first ferrite bead FB1, which is coupled to each of the lines A-C to reduce noise coming from the vehicle by increasing the high frequency input impedance, which noise can result in magnified EMI from the device 10. Second, third and fourth ferrite beads FB2-FB4 are also included so as to provide enhanced common mode filtering.

In the illustrated embodiment, the main circuit card assembly 16 comprises a main circuit card 116, first and second LED control integrated circuits 170A and 170B mounted to the circuit card 116 and the first and second power switching transistors 172A and 172B, which are also mounted to the circuit card 116. First and second sets 14A and 14B of the IR LEDs 14 are also mounted to the circuit card 116, wherein each set 14A and 14B comprises, in the illustrated embodiment, twelve IR LEDs. The first and second control integrated circuits 170A and 170B receive power via lines E4 and E6. When a power activation signal is provided by the first integrated circuit 170A to the first power switching transistor 172A, the first set 14A of IR LEDs is turned on. When a power activation signal is provided by the second integrated circuit 170B to the second power switching transistor 172B, the second set 14B of IR LEDs is turned on. The control integrated circuits 170A and 170B are also referred to herein as control circuits. The control circuits may comprise, instead of control integrated circuits, application-specific integrated circuits (ASICs).

The dim signal, noted above, is coupled to the second control integrated circuit 170B via line E5. Hence, when the 3-position switch is in its "low beam" position, the switch outputs a dim signal comprising a ground signal causing the second integrated circuit 170B to be deactivated. Further, when the 3-position switch is in its "low beam" position, the first integrated circuit 170A is caused to generate a power activation signal to the first power switching transistor 172A such that the first set 14A of IR LEDs 14 are activated, while the second integrated circuit 170B, which has been deactivated, does not generate a power activation signal to the second power switching transistor 172B, such that the second set 14B of IR LEDs 14 are not activated. When the 3-position switch is in its "high beam" position, the first integrated circuit 170A generates a power activation signal to the first power switching transistor 172A and the second integrated circuit 170B generates a power activation signal to the second power switching transistor 172B, such that the first and second sets 14A and 14B of IR LEDs 14 are turned on.

To further reduce EMI, a first 10Ω resistor 174A is provided between the first integrated circuit 170A and the first power switching transistor 172A and a second 10Ω resistor 174B is provided between the second integrated circuit 170B and the second power switching transistor 172B, see FIG. 7. The first and second resistors 174A and 174B function to round the corners of switching waveforms generated by the first and second transistors 172A and 172B by creating a time constant between the resistors 174A and 174B and an effective gate capacitance of the transistors 172A and 172B, thereby reducing the number of harmonics generated in the switching waveforms.

A temperature sensor 130, see FIGS. 1A and 7, an integrated circuit thermostat in the illustrated embodiment, is provided on the main circuit card 116 of the main circuit card assembly 16 and is coupled to the first and second control integrated circuits 170A and 170B. The temperature sensor 130 senses if the temperature of the circuit card assembly 16 exceeds a predefined threshold temperature. In the illustrated embodiment, the temperature sensor 130 senses if the temperature of the circuit card assembly 16 exceeds the predefined threshold temperature by sensing the temperature of the main circuit card 116. Hence, if the temperature of the main circuit card 116 exceeds a predefined threshold temperature, such as between about 50 degrees C. and about 100 degrees C. and preferably about 67 degrees C., then the second integrated circuit 170B on the circuit card 116, in response to receiving a temperature signal from the sensor 130 indicating that the circuit card temperature is above the predefined threshold temperature, automatically turns off the second set 14B of the LEDs 14, to prevent damage to the device 10 from overheating. If the temperature of the circuit card 116 drops a predefined amount below the threshold temperature, e.g., drops about 5 degrees to 62 degrees C., then all the LEDs will be illuminated again. It is believed that overheating may occur when the light device 10 is accidentally turned on in a stationary vehicle during a peak temperature period of a very hot day. It is further believed that energy in the form of heat generated by ½ of the LEDs 14 should not damage the light device 10, but should be able to provide minimal IR illumination if needed. Hence, the thermal regulation provided by the temperature sensor 130 and the second integrated circuit 170B protects the light device 10 from overheating by turning off the second set 14B of the LEDs 14 when the circuit card temperature exceeds the predefined threshold temperature but still provides some level of IR light illumination resulting from the remaining portion of the LEDs being illuminated.

As noted above, the LEDs 14 may have a wavelength of about 880 nm. This wavelength falls near the preferred wavelength range for night vision goggles. However, the LEDs emit a visible "red" glow. The visible light filter 24 comprises a long wavelength pass filter, one of which is commercially available from Gentex Corporation, Carbondale, Pa., under the product designation "Filtron E800." The visible light filter 24 functions to allow the IR light to pass through the opening 22A in the face plate 22 but blocks most if not all of the visible "red" glow or light emitted by the LEDs.

Because a large number of LED's 14 are provided in the light device 10, heat transfer structure 50 is provided to enhance heat transfer from the LEDs 14 to the main casing base 12. The circuit card 116 has bores drilled or formed in it. The number of bores (not shown) corresponds to or exceeds the number of LEDs 14. The heat transfer structure 50 comprises copper fillings (not shown) provided in the circuit card bores, wherein each copper filling extends from a first side 16A of the circuit card 116 to a second side 16B. The LEDs 14 are mounted to the first side 16A of the circuit card 116. One or more copper fillings are bonded to a corresponding one of the LEDs 14 via a solder connection. Hence, a plurality of copper fillings can be associated with each LED 14. The heat transfer structure 50 further comprises an AL cold plate 30 and the flexible heat transfer pads 20. The AL cold plate 30 is adhesively mounted to a second side 16B of the circuit card 116 opposite to the first side 16A and is adhesively coupled to the copper fillings. The adhesive used to couple the cold plate 30 to the circuit card 116 may comprise "Fasmetal 10" from ITW Devcon. The flexible heat transfer pads 20 are positioned between and contact each of the cold plate 30 and the main casing 11 to further enhance heat transfer from the LEDs 14. The pads 20 are used as a heat transfer interface instead of a thermally conductive adhesive to allow the circuit card assembly 16 to be removed from the main casing 11 for repair or replacement. The flexible heat transfer pads 20 may comprise elastomeric thermal interface Berguist pads, which are commercially available from Orion Industries under the product designation "GP 1500R-0.010-02-0816-NA." Hence, energy in the form of heat is transferred from the LEDs 14, to the copper fillings in the circuit card assembly holes, to the AL cold plate 30, to the flexible heat transfer pads 20, and then to the main casing 11 including the cooling fins 12A on main casing 11.

The IR light device 10 is capable of operating at a voltage falling within a voltage range of from 10 VDC to 32 VDC.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. An infrared (IR) light device comprising:
   a main casing filled with a gas to prevent condensation from forming on an interior surface of a light filter mounted inside the main casing;
   a plurality of IR light emitting diodes (LEDs) mounted in the main casing; and
   a heat transfer structure for transferring heat from the LEDs to the main casing, wherein the heat transfer structure comprises:
      copper fillings positioned in bores in a circuit card to which the LEDs are mounted, the copper fillings being coupled to the LEDs;
      a metal plate positioned to contact the copper fillings; and
      thermal transfer elements contacting the metal plate and the main casing.

2. The light device as set out in claim 1, further comprising:
   a main circuit card assembly comprising the circuit card;
   a temperature sensor for sensing when a temperature of the circuit card assembly exceeds a predefined threshold temperature; and
   control structure for turning off a portion but not all of the LEDs when the circuit card assembly temperature exceeds the predefined threshold temperature.

3. The light device as set out in claim 1, wherein the light device is capable of operating at a voltage falling within a voltage range of from 10 VDC to 32 VDC.

4. The light device as set out in claim 1, further comprising a light filter allowing IR light to pass through an opening in the main casing and blocking a substantial portion of visible "red" light emitted by the LEDs.

5. The light device as set out in claim 1, wherein the gas comprises one of argon and nitrogen.

6. The light device as set out in claim 1, further comprising:
   a main circuit card assembly comprising the circuit card; and control structure for turning off a portion but not all of the LEDs when a dim signal provided by a switch mounted in a vehicle to which the light device is mounted is generated.

7. An infrared (IR) light device comprising:
a main casing;
a plurality of IR light emitting diodes mounted in the main casing;
a temperature sensor for sensing when a temperature within the main casing exceeds a predefined threshold; and
control structure for turning off a portion but not all of the LEDs when the temperature within the main casing exceeds the predefined threshold.

8. The light device as set out in claim 7, further comprising a circuit card assembly comprising a circuit card to which the LEDs are mounted, the temperature sensor sensing when a temperature of the circuit card assembly exceeds the predefined threshold temperature, and wherein the control structure turns off the portion of the LEDs when the temperature of the circuit card assembly exceeds the predefined threshold.

9. The light device as set out in claim 7, further comprising structure for transferring heat from the LEDs to the main casing.

10. The light device as set out in claim 9, wherein the heat transfer structure comprises:
copper fillings positioned in bores in a circuit card to which the LEDs are mounted, the copper fillings coupled to said LEDs;
a metal plate positioned to contact the copper fillings; and
thermal transfer elements contacting the metal plate and the main casing.

11. The light device as set out in claim 7, further comprising a light filter allowing IR light to pass through an opening in the main casing and blocking a substantial portion of visible "red" light emitted by the LEDs.

12. The light device as set out in claim 7, wherein the control structure turns off a portion but not all of the LEDs when a dim signal provided by a switch mounted in a vehicle to which the light device is mounted is generated.

13. The infrared (IR) light device of claim 7, wherein the plurality of LEDs comprise a first set of LEDs and a second set of LEDs, wherein the first set and second set each comprise about half of the total number of LEDs, and wherein the control structure turns off only the second set of LEDs when the temperature within the main casing exceeds the predefined threshold.

14. An infrared (IR) light device comprising:
a main casing;
a plurality of IR light emitting diodes (LEDs) mounted in the main casing;
control structure coupled to the LEDs for actuating the LEDs; and
a common mode filter associated with the control structure for reducing electromagnetic interference (EMI).

15. The light device as set out in claim 14, wherein the control structure comprises at least one control circuit and at least one power switching transistor.

16. The light device as set out in claim 15, further comprising a resistor provided between the at least one control circuit and the at least one power switching transistor.

17. The light device as set out in claim 14, wherein the control structure turns off a portion but not all of the LEDs when a dim signal provided by a switch mounted in a vehicle to which the light device is mounted is generated.

18. The infrared (IR) light device of claim 14, wherein the common mode filter comprises a common-mode choke and first, second, third, fourth, and fifth capacitors, wherein the third capacitor provides an impedance mismatch to prevent common mode noise from entering the device.

19. The infrared (IR) light device of claim 14, wherein the common mode filter comprises a first ferrite bead to reduce noise entering the device by increasing high frequency input impedance.

20. The infrared (IR) light device of claim 19, wherein the common mode filter further comprises second, third, and fourth ferrite beads to increase filtering properties of the common mode filter.

\* \* \* \* \*